(12) United States Patent
Scheulov (10) Patent No.: US 12,453,188 B2
(45) Date of Patent: *Oct. 21, 2025

(54) BIFACIAL CRYSTALLINE SILICON SOLAR PANEL WITH REFLECTOR

(71) Applicant: BAKERSUN, San Francisco, CA (US)

(72) Inventor: Ivan I. Scheulov, San Francisco, CA (US)

(73) Assignee: BAKERSUN, San Francisco, CA (US)

( * ) Notice: Subject to any disclaimer, the term of this patent is extended or adjusted under 35 U.S.C. 154(b) by 215 days.

This patent is subject to a terminal disclaimer.

(21) Appl. No.: 17/667,766

(22) Filed: Feb. 9, 2022

(65) Prior Publication Data

US 2022/0278246 A1  Sep. 1, 2022

Related U.S. Application Data

(60) Division of application No. 15/172,970, filed on Jun. 3, 2016, now abandoned, which is a continuation of application No. 14/259,835, filed on Apr. 23, 2014, now Pat. No. 9,379,270, which is a division of application No. 13/778,689, filed on Feb. 27, 2013, (Continued)

(51) Int. Cl.
*H10F 10/14* (2025.01)
*H10F 19/90* (2025.01)
*H10F 77/20* (2025.01)
*H10F 77/30* (2025.01)

(Continued)

(52) U.S. Cl.
CPC .......... *H10F 10/148* (2025.01); *H10F 10/14* (2025.01); *H10F 19/902* (2025.01); *H10F 77/211* (2025.01); *H10F 77/215* (2025.01); *H10F 77/244* (2025.01); *H10F 77/311* (2025.01);

(Continued)

(58) Field of Classification Search
CPC .......... H01L 31/0684; H01L 31/02167; H01L 31/022425; H01L 31/022433; H01L 31/022466; H01L 31/0504; H01L 31/0525; H01L 31/0547; H01L 31/068; H01L 31/0488; Y02E 10/52; Y02E 10/547; H10F 10/14; H10F 10/148; H10F 19/807; H10F 19/902; H10F 19/211; H10F 77/215;

(Continued)

(56) References Cited

U.S. PATENT DOCUMENTS 4,551,352 A * 11/1985 Pankove .............. H01L 21/3003
136/258
2005/0252544 A1* 11/2005 Rohatgi .............. H01L 31/1804
136/262

(Continued)

FOREIGN PATENT DOCUMENTS

WO   WO-2013106439 A1 *  7/2013  ..... H01L 31/022466

OTHER PUBLICATIONS

U.S. Appl. No. 61/586,550 (Year: 2012).*

*Primary Examiner* — Devina Pillay
(74) *Attorney, Agent, or Firm* — Greenberg Traurig, LLP (57) ABSTRACT

Bifacial crystalline solar cells and associated solar panel systems are provided. The cells include a p-type crystalline silicon layer and a barrier layer. The panels include at least two rows of cells. The cells in each row are connected to one another in series. The rows are connected in parallel. A reflector is used to reflect light towards the underside of the panel. A long axis of the reflector is arranged to be parallel to the rows of cells.

13 Claims, 9 Drawing Sheets

Related U.S. Application Data now Pat. No. 9,379,269, which is a continuation of application No. PCT/US2013/027766, filed on Feb. 27, 2013.

(60) Provisional application No. 61/649,236, filed on May 19, 2012, provisional application No. 61/604,517, filed on Feb. 29, 2012.

(51) Int. Cl.
*H10F 77/42* (2025.01)
*H10F 77/67* (2025.01)

(52) U.S. Cl.
CPC ........... *H10F 77/488* (2025.01); *H10F 77/67* (2025.01); *Y02E 10/52* (2013.01); *Y02E 10/547* (2013.01)

(58) Field of Classification Search
CPC .... H10F 77/244; H10F 77/311; H10F 77/488; H10F 77/67; H10F 77/211
See application file for complete search history.

(56) References Cited

U.S. PATENT DOCUMENTS

2010/0147385 A1* 6/2010 Kawano ................. H10K 30/30
136/263
2010/0275995 A1* 11/2010 Kaes ..................... H10F 10/148
257/E21.135

* cited by examiner

BIFACIAL CRYSTALLINE SILICON SOLAR PANEL WITH REFLECTOR

CROSS-REFERENCE TO RELATED APPLICATIONS

This patent application is a divisional of U.S. patent application Ser. No. 15/172,970, filed Jun. 3, 2016, which is a continuation of U.S. patent application Ser. No. 14/259,835, filed Apr. 23, 2014, which is a divisional of U.S. patent application Ser. No. 13/778,689, filed Feb. 27, 2013, which is a continuation of International Application No. PCT/US2013/027766, filed Feb. 26, 2013, which claims priority under 35 U.S.C. § 119(e) to U.S. Provisional Application No. 61/604,517, filed Feb. 29, 2012, entitled "Bifacial c-Si Solar Panel with Reflectors and V2O5", and to U.S. Provisional Application No. 61/649,236, filed May 19, 2012, entitled "Bifacial c-Si Solar Panel with Reflectors and Various Interface Materials". Each of the above-identified patent applications is incorporated herein by reference in its entirety.

BACKGROUND

Photovoltaic panels ("solar panels") can be made to convert sunlight into electricity. There are various technologies for making photovoltaic panels, including mono-crystalline silicon wafer based, multi-crystalline silicon wafer based, and thin film silicon based. Many commercially available photovoltaic panels are made with only one side exposed to sunlight.

SUMMARY OF THE DISCLOSURE

Broadly, the present disclosure relates to improved photovoltaic solar cell systems and methods. In one approach, a bifacial solar cell includes a p-type crystalline silicon layer coupled to an n-type semiconductor layer. The bifacial solar cell may include a plurality of first metal conductivity lines coupled to an n-type semiconductor layer. At least some of the first metal conductivity lines may be in electrical communication with the n-type semiconductor layer. The bifacial solar cell may include a barrier layer coupled to the p-type crystalline silicon layer. The barrier layer may include one or more of oxides of vanadium, oxides of molybdenum, nitrides of aluminum, tungsten nickel oxide, and boron doped diamond. In one embodiment, the barrier layer may have a thickness of from 1.0 nanometers to 10.0 nanometers. In other embodiments, the barrier layer may have a thickness of from 2.0 nanometers to 6.0 nanometers. The bifacial solar cell may include a transparent conductive layer coupled to the barrier layer. The bifacial solar cell may include a plurality of second metal conductivity lines coupled to the transparent conductive layer. At least some of the second metal conductivity lines may be in electrical communication with the transparent conductive layer. The bifacial solar cell may further include a passivation layer coupled to the first side of the n-type semiconductor layer, and disposed between the plurality of first metal conductivity lines.

A photovoltaic system having a solar panel and at least one reflector is also disclosed. The solar panel includes solar cells, at least some of which are bifacial solar cells. The solar cells are arranged in the panel to form at least two rows. The first row of solar cells may be electrically connected in series. The first row of solar cells may have a first long axis. The second row of solar cells may be electrically connected in series. The second row of solar cells may have a second long axis coincidental to the first long axis. The first row of solar cells may be electrically connected to the second row of solar cells in parallel. The reflector is located proximal the solar panel. The reflector includes a reflective surface facing the solar panel. In one embodiment, the reflective surface may have a third long axis that is coincidental to the first and second long axes. In one embodiment, the third long axis forms an angle of from 5° to negative 5° to the first and second long axes. The reflective surface may comprise at least one of aluminum, silver, and/or a white colored material. In one embodiment, the reflective surface may have a compound-parabolic-shaped profile. In other embodiments, the reflective surface may have a semicircular-shaped profile, or a profile comprising planar surfaces. The solar panel may further include a first transparent protective layer and/or a second transparent protective layer. The solar cells in the solar panel may be disposed between the first transparent protective layer and the second transparent protective layer. The first transparent protective layer may be coupled to the plurality of first metal conductivity lines of the bifacial solar cells via a first lamination layer. The second transparent protective layer may be coupled to the plurality of second metal conductivity lines of the bifacial solar cells via a second lamination layer.

These and other aspects and advantages, and novel features of this new technology are set forth in part in the description that follows and will become apparent to those skilled in the art upon examination of the following description and figures, or may be learned by practicing one or more embodiments of the technology provided for by the present disclosure.

DETAILED DESCRIPTION

Reference will now be made in detail to the accompanying drawings, which at least assist in illustrating various pertinent embodiments of the new technology provided for by the present disclosure.

Referring now to FIGS. 1-4, one embodiment of a bifacial solar panel system is illustrated. In the illustrated embodiment, the system includes a solar panel 100 and a reflector 120 located proximal the solar panel 100. The solar panel 100 includes a plurality of bifacial solar cells 110 arranged in two adjacent rows 112, 114. As used herein, "bifacial solar cell" means a semiconductor-based solar cell having an upper surface and a lower surface, wherein both the upper and lower surfaces are photoactive. As used herein, "photoactive" means capable of responding to light photoelectrically. The first row of bifacial solar cells 112 has a first long axis 113. The second row of bifacial solar cells 114 has a second long axis 115. The reflector 120 includes at least one reflective surface 130 facing the panel 100. The reflective surface 130 has a third long axis 132. The reflector 120 is configured to promote reflection of solar radiation (sunlight) towards the panel 100.

In the illustrated embodiment, the first row 112 is located proximal to the second row 114 such that the first long axis 113 is coincidental to the second long axis 115. Furthermore, the reflector 120 is oriented such that the third long axis 132 is coincidental to both the first and second long axes 113, 115. As used herein, "coincidental" means approximately parallel. For example, a first line may be coincidental to the long axis of a reflector (e.g., forming an angle from about 15° to about negative 15° to the long axis of the reflector).

The bifacial solar cells 110 of the first row 112 are electrically connected to one another in series. Similarly, the bifacial solar cells 110 of the second row 114 are electrically connected to one another in series. The first row 112 is electrically connected to the second row 114 in parallel. The bifacial solar cells 110 are configured such that each cell has a useful voltage, generally on the order of from about 0.5V to about 1.5V.

The illustrated bifacial solar panel system can absorb light from both sides and over a larger area than the area of the panel itself. This is facilitated through the use of the reflector 120 that reflects sunlight toward the underside of the solar panel 100. Furthermore, the reflective surface 130 having a long axis 132 may facilitate the reflection of sunlight onto the underside of the solar panel 100 such that the amount of reflected sunlight incident on the panel is essentially uniform across the panel in a direction parallel to the long axis 132, yet highly non-uniform across the panel in a direction perpendicular to the long axis 132. As described above, the cells within the rows 112, 114 are electrically connected to one another in series, and the rows 112, 114 are electrically connected to one another in parallel. Furthermore, the rows 112, 114 are arranged with their long axes 113, 115 being coincidental to the long axis of the reflector 132. Thus, the bifacial solar cells 110 are oriented to allow each of the cells in a row to receive approximately the same amount of sunlight as the other cells in that row, even though the sunlight incident on the underside of the panel 100 may be highly non-uniform in the direction perpendicular to the long axis of the reflector 132 (e.g., from the left side of the panel to center of the panel 100). For example, a cell in the first row 112 may receive approximately the same amount of sunlight as the other cells in the first row 112, even though the cells in the second row 114 may receive much less sunlight. Thus, interconnecting the bifacial solar cells 110 in series to form rows, connecting the rows in parallel, and orienting the rows coincidental to the long axis of the reflector 132 may improve panel efficiency without requiring an increase in panel area.

The Bifacial Solar Cells

Figure 3:
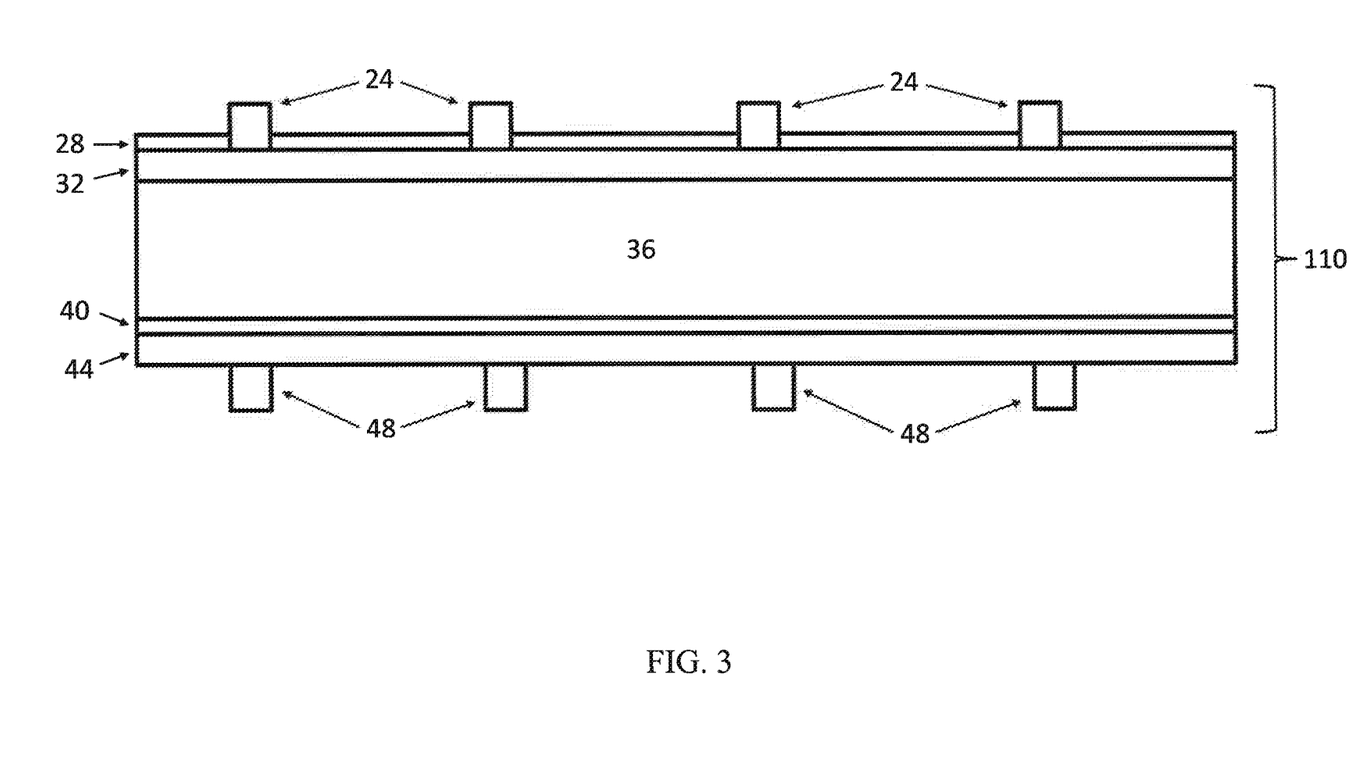
FIG. 3 a cross-sectional schematic illustration of an exemplary bifacial solar cell of the photovoltaic system of FIG. 1.

The bifacial solar cell 110 includes an n-type semiconductor layer 32, a p-type crystalline silicon layer 36, a barrier layer 40, and a transparent conductive layer 44. The n-type semiconductor layer 32 is coupled to the p-type crystalline silicon layer 36. The p-type crystalline silicon layer 36 is coupled to the barrier layer 40. The barrier layer 40 is coupled to the transparent conductive layer 44. The bifacial solar cell 110 includes a plurality of first metal conductivity lines 24 coupled to the n-type semiconductor layer 32, and located opposite the p-type crystalline silicon layer 36. The bifacial solar cell 110 further includes a plurality of second metal conductivity lines 48 coupled to the transparent conductive layer 44, and located opposite the barrier layer 40.

The n-type semiconductor layer 32 generally comprises semiconducting materials adapted to promote free electrons. The n-type semiconductor layer 32 may comprise semiconducting materials doped with phosphorous, antimony, and/or arsenic, among others. The n-type semiconductor layer 32 may be crystalline, amorphous, multi-crystalline, or any combination thereof. In one embodiment, the n-type semiconductor layer 32 comprises phosphorous doped silicon.

The p-type crystalline silicon layer 36 generally comprises crystalline silicon semiconducting materials adapted to promote electron holes. As used herein, "crystalline silicon" means a material composed of at least 99.9% silicon whose constituent atoms, molecules, or ions are arranged in an ordered pattern extending in all three spatial dimensions. Crystalline silicon includes multi-crystalline silicon. As used herein, "multi-crystalline" (alternatively "polycrystalline") means a solid material composed of many small crystals ("grains") of varying size and varying orientation to one another, wherein the constituent atoms, molecules, or ions of each crystal are arranged in an ordered pattern extending in all three spatial dimensions. Crystalline silicon may be solidified from a melt of essentially pure molten silicon (e.g., 99.99% silicon). Crystalline silicon does not include amorphous silicon. As used herein "amorphous silicon" means a material containing silicon whose constituent atoms, molecules, or ions lack an extended ordered pattern in all three spatial dimensions.

The p-type crystalline silicon layer 36 may comprise crystalline semiconducting materials doped with boron, aluminum, and/or gallium, among others. In one embodiment, p-type crystalline silicon layer 36 comprises boron doped crystalline silicon (e.g., a boron doped silicon wafer).

Sufficient thickness of the p-type crystalline silicon layer 36 may facilitate structural integrity of the bifacial solar cell 110. In one embodiment, the thickness of the p-type crystalline layer 36 is from about 20,000 nanometers to about 300,000 nanometers. In other embodiments, the thickness of the p-type crystalline layer 36 is from about 60,000 nanometers to about 250,000 nanometers, or from about 100,000 nanometers to about 200,000 nanometers.

The barrier layer 40 generally may include one or more of oxides of vanadium, oxides of molybdenum, nitrides of aluminum, tungsten nickel oxide, and boron doped diamond. In particular, oxides of vanadium suitable for the barrier layer 40 include those oxides of vanadium described by the empirical formula $V_xO_y$, wherein $0.130 \leq x/(x+y) \leq 0.60$. In one embodiment, the barrier layer 40 is an oxide of vanadium having the empirical formula $V_2O_5$ (i.e., $V_xO_y$, wherein $x/(x+y)=0.2857$). Suitable thicknesses of the barrier layer 40 may range from about 1.0 nanometers to about 10.0 nanometers. In one embodiment, the barrier layer 40 has a thickness of not greater than 10.0 nanometers. In one embodiment, the barrier layer 40 has a thickness of not greater than 6.0 nanometers. In one embodiment, the barrier layer 40 has a thickness of at least 1.0 nanometers. In one embodiment, the barrier layer 40 has a thickness of at least 2.0 nanometers. In one embodiment, the barrier layer 40 has a thickness of about 3 nanometers.

The transparent conductive layer 44 generally comprises conductive oxides. The transparent conductive layer 44 may include one or more of fluorinated tin oxides, aluminum doped zinc oxides, and indium tin oxides, to name a few. In one embodiment, the transparent conductive layer 44 is fluorinated tin oxides.

The first metal conductivity lines 24 and second metal conductivity lines 48 may be any high conductivity material adapted to facilitate current travel over the bifacial solar cell 110. These metal conductivity lines 24, 48 may increase conductivity in the bifacial solar cell 110, which may facilitate travel of current over longer distances. These metal conductivity lines 24, 48 may be used to collect the current from across the surfaces of the bifacial solar cell 110. The size of the metal conductivity lines 24, 48 should be restricted so as to restrict shading of the cell. In some embodiments the first metal conductivity lines 24 are made of the same materials as the second metal conductivity lines 48. In other embodiments, the first metal conductivity lines 24 are made of different materials than the second metal conductivity lines 48. The first metal conductivity lines 24 and the second metal conductivity lines 48 may comprise one of more of copper, aluminum, or silver. In one embodiment, both the first and the second metal conductivity lines 24, 48 comprise silver.

The bifacial solar cells 110 may optionally include a passivation layer 28 coupled to the n-type semiconductor layer 32, and disposed between the plurality of first metal conductivity lines 24. The passivation layer 28 may be any suitable material adapted to restrict recombination of electrons and electron holes on the surface of the n-type semiconductor layer 32. In one embodiment, the passivation layer 28 comprises silicon nitride.

Figure 5:
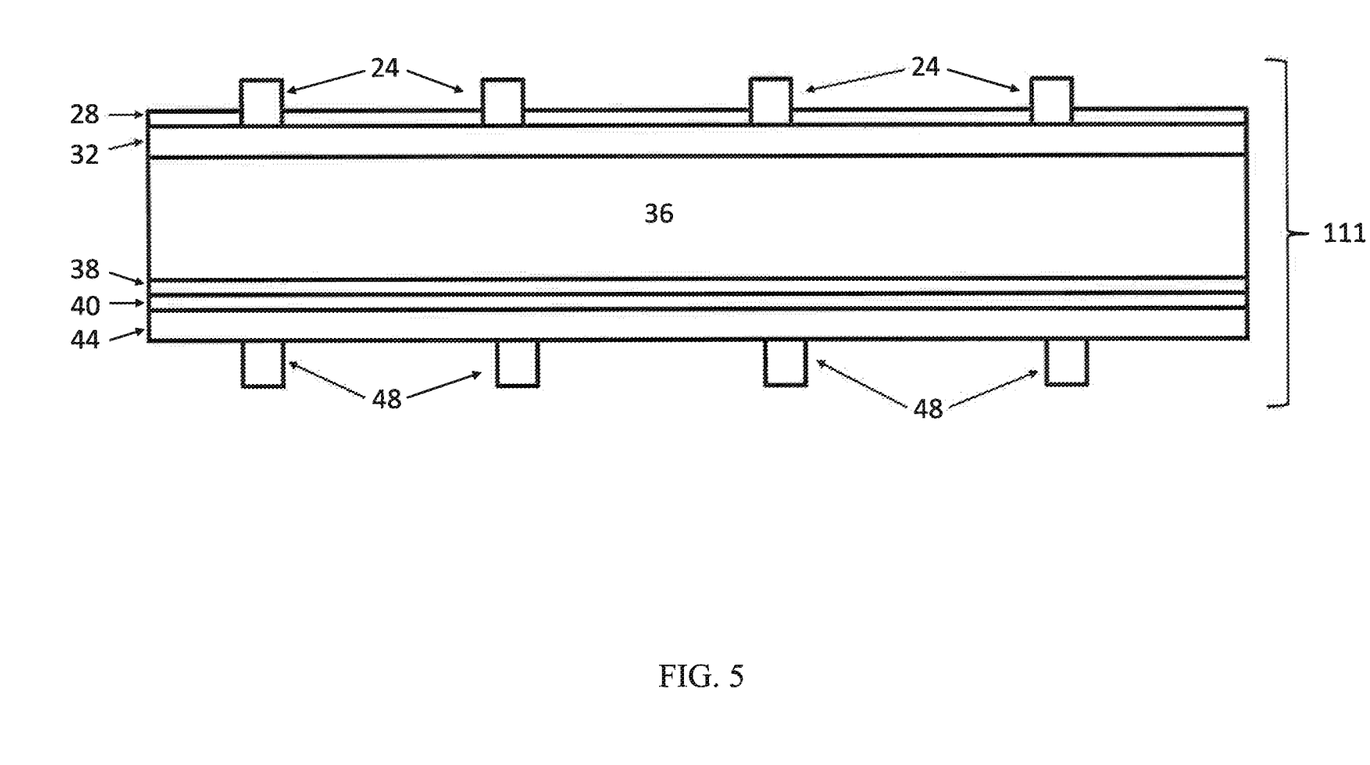
FIG. 5 is a schematic illustration of another embodiment of a bifacial solar cell, having an optional, highly doped p-type semiconductor layer.

Turning now to FIG. 5, an alternative embodiment of a bifacial solar cell 111 is illustrated. The bifacial solar cell 111 may optionally include a highly doped p-type semiconductor layer 38 disposed between, and coupled to, the p-type crystalline silicon layer 36 and the barrier layer 40. The highly doped p-type semiconductor layer 38 generally comprises a semiconductor material doped with boron, aluminum, and/or gallium among others. The highly doped p-type semiconductor layer 38 may have a high concentration of electron holes compared to the p-type crystalline silicon layer 36. The highly doped p-type semiconductor layer 38 may comprise amorphous and/or multi-crystalline semiconductor material. In one embodiment, the highly doped p-type semiconductor layer 38 comprises boron doped silicon.

Method of Making the Bifacial Solar Cell and Panel System

A process of making the bifacial solar cell 110 begins with a p-type (e.g., boron doped) crystalline silicon wafer having an upper face, a lower face, and sides (i.e., "surfaces"). The surfaces of the wafer may be saw-damage etched to a depth of from about 8 microns to about 15 microns. Next, the surfaces of the wafer may be texture etched to a depth of from about 3 microns to about 7 microns. Next, the surfaces of the wafer may be covered with phosphorous. Next, the phosphorous-covered surfaces of the wafer may be annealed, thereby facilitating the diffusion of phosphorous into the surfaces of the wafer and forming an amorphous phosphorous-silicon glass layer over the surfaces of the wafer. Next, the lower face and the sides of the wafer may be etched, thereby removing both the amorphous phosphorous-silicon glass layer and the diffused phosphorous layer from all surfaces of the wafer except the upper face. Next, the amorphous phosphorous-silicon glass layer may be removed from the upper face, via etching, leaving only the diffused phosphorous layer on the upper face of the wafer. Thus, at this point in the process the product includes an n-type semiconductor layer 32 (the diffused phosphorous layer on the upper face of the wafer) coupled to a p-type crystalline silicon layer 36 (the wafer). Next, a layer of silicon nitride may be deposited over the n-type semiconductor layer 32 via plasma-enhanced chemical vapor deposition. Next, silver conductivity lines may be printed over the silicon nitride layer. Next, the upper face of the wafer, including the silicon nitride layer and the silver conductivity lines may be "fired", thereby facilitating a process whereby the silver conductivity lines may etch through the silicon nitride layer and come into electrical contact with the n-type semiconductor layer 32. Thus, a plurality of first metal conductivity lines 24 (the silver conductivity lines) and a passivation layer 28 (the silicon nitride layer) may be coupled to the n-type silicon layer 32. Next, vanadium oxide may be deposited onto the lower face of the wafer, thereby forming a barrier layer 40 (the vanadium oxide) coupled to the p-type crystalline silicon layer 36. Next, a transparent conductive oxide may be deposited over the barrier layer 40, thereby forming a transparent conductive layer 44. Next, silver conductivity lines may be printed over the transparent conductive layer 44. Finally, the silver conductivity lines may be "fired". Thus, a plurality of second metal conductivity lines 48 may be coupled to the transparent conductive layer 44.

The Solar Panel

Figure 2:
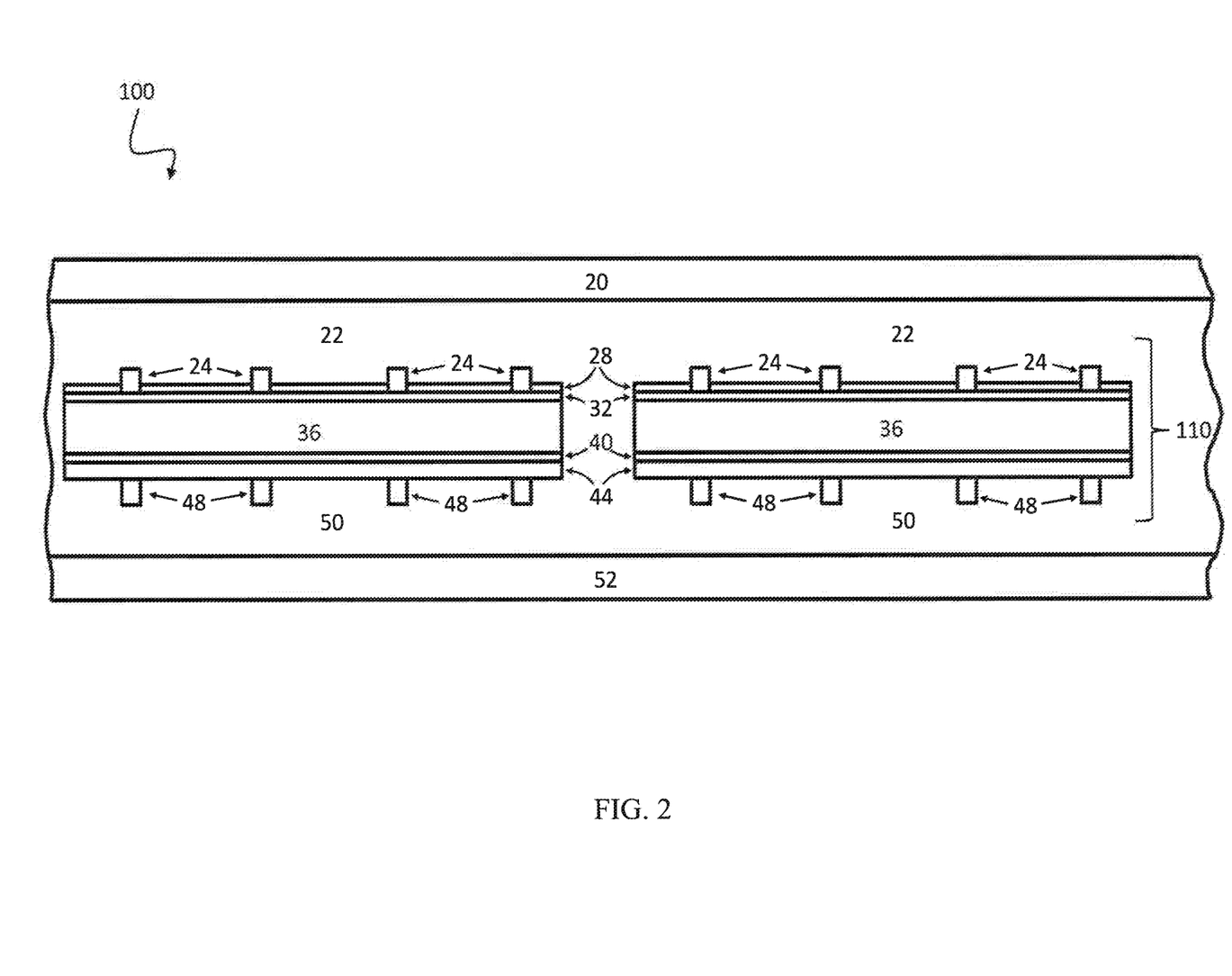
FIG. 2 is a partial, cross-sectional, schematic illustration of the photovoltaic system of FIG. 1.

In the illustrated embodiment, the solar panel 100 comprises bifacial solar cells 110 disposed between a first transparent protective layer 20 and a second transparent layer 52. The first transparent protective layer 20 may be adhered to the upper surfaces of the bifacial solar cells 110 via a first lamination layer 22. The second transparent protective layer 52 may be adhered to the lower surfaces of the bifacial solar cells 110 via a second lamination layer 50.

The first transparent protective layer 20 and the second transparent protective layer 52 may be any suitable transparent materials adapted to protect bifacial solar cells 110 and form the solar panel 100. In one embodiment, the first and second transparent layers 20, 52 comprise low iron glass.

The first lamination layer 22 and the second lamination layer 50 may be any suitable transparent adhesive material adapted to secure the bifacial solar cells 110 between the first and second transparent layers 20, 52. In one embodiment, the first lamination layer 22 and the second lamination layer 50 comprise ethyl-vinyl-acetate (EVA).

Figure 1:
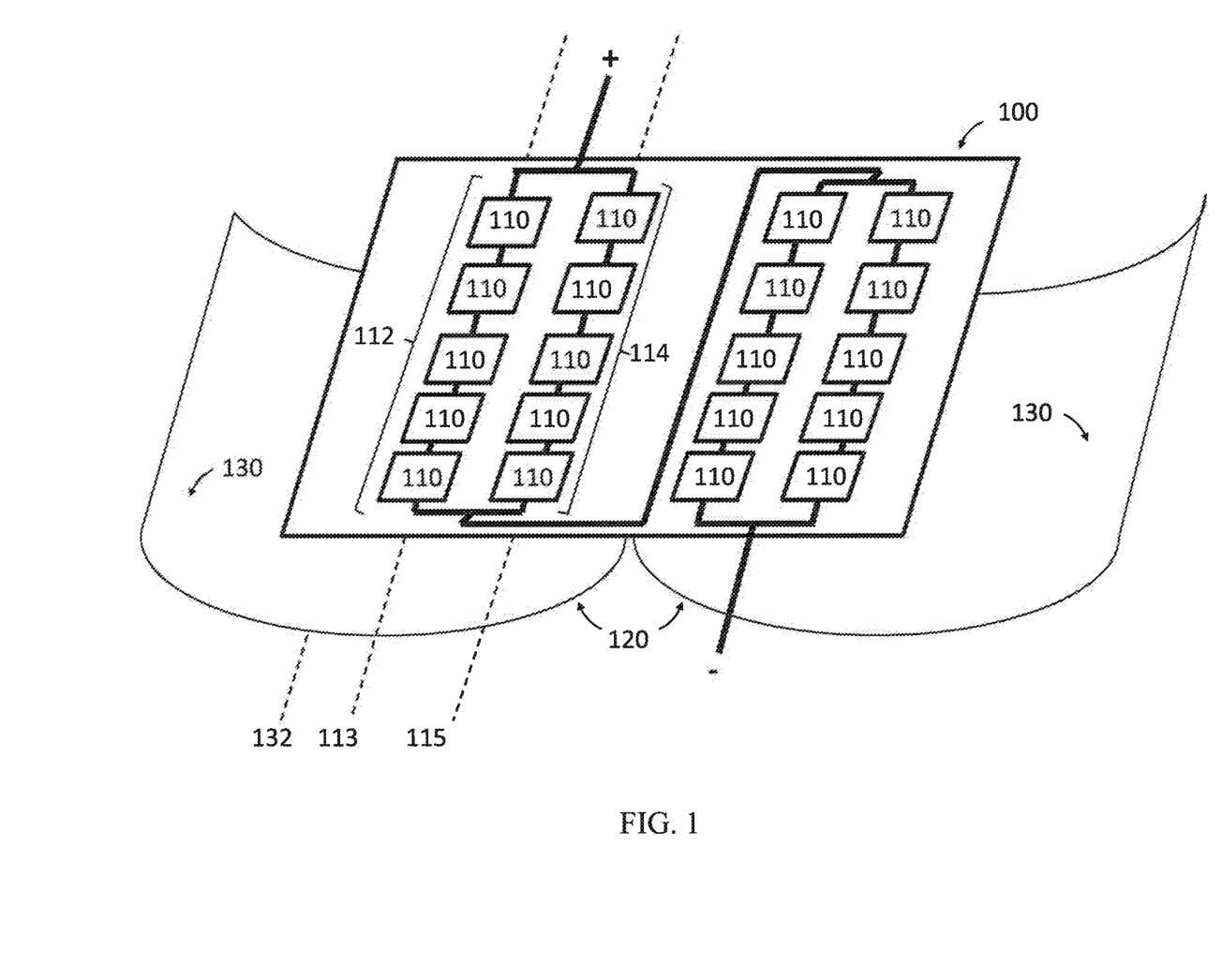
FIG. 1 is a schematic, perspective view of one embodiment of a photovoltaic system, illustrating the electrical connections between the bifacial solar cells.

As described above, in one embodiment, the bifacial solar cells 110 of the solar panel 100 may be arranged to form two rows 112, 114, wherein the bifacial solar cells 110 of the first row are electrically connected to one another in series, wherein the bifacial solar cells 110 of the second row are electrically connected to one another in series, and wherein the first row 112 is electrically connected to the second row 114 in parallel. Further, the long axes 113, 115 of the first and second row may be oriented to be coincidental to the long axis of the reflector 132. However, in other embodiments the bifacial solar cells of the solar panel may be in arranged in more than two rows (e.g., three rows, four rows, five rows, etc.) wherein the bifacial solar cells within each row are electrically connected to one another in series, wherein the rows are electrically connected in parallel, and wherein each of the rows has a long axis oriented to be coincidental to the long axis of the reflector 132.

The Reflectors

Figure 4:
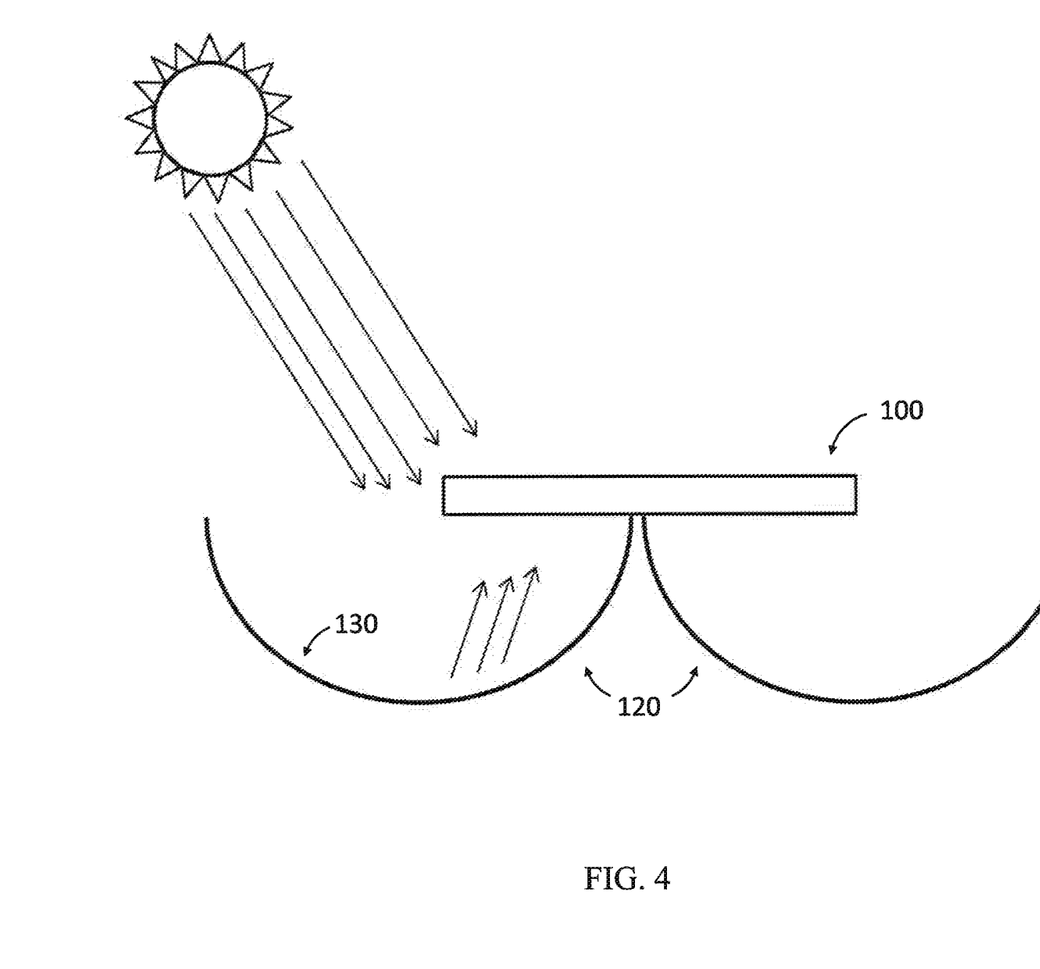
FIG. 4 is a schematic, perspective view of the photovoltaic system of FIG. 1.

The reflector(s) 120 may be any suitable device adapted to reflect solar radiation toward the underside of the solar panel 100. In the illustrated embodiment of FIGS. 1-4, the system employs two reflectors 120 interconnected to the bottom of the solar panel 100. However, any number of reflectors 120 may be used with the solar panel 100, and on any side of the solar panel 100. As shown in FIG. 4, the arrangement/orientation of the reflectors 120 and the solar panel 100 should allow for sunlight to reflect towards the solar panel 100. Generally, this arrangement is promoted via the use of suitable frames adapted to hold the solar panel 100 and/or reflectors 120 proximal to one another and at a suitable distance from one another.

The reflectors 120 should have a reflective surface 130 that includes a long axis 132. This long axis 132 should be arranged/oriented to be coincidental to the long axes of the first and second rows of semiconductor cells 113, 115, for the reasons described above. In this regard, the long axis 132 of the reflector 120 may, in some instances, symmetrically divide the reflector 120.

Figure 6:
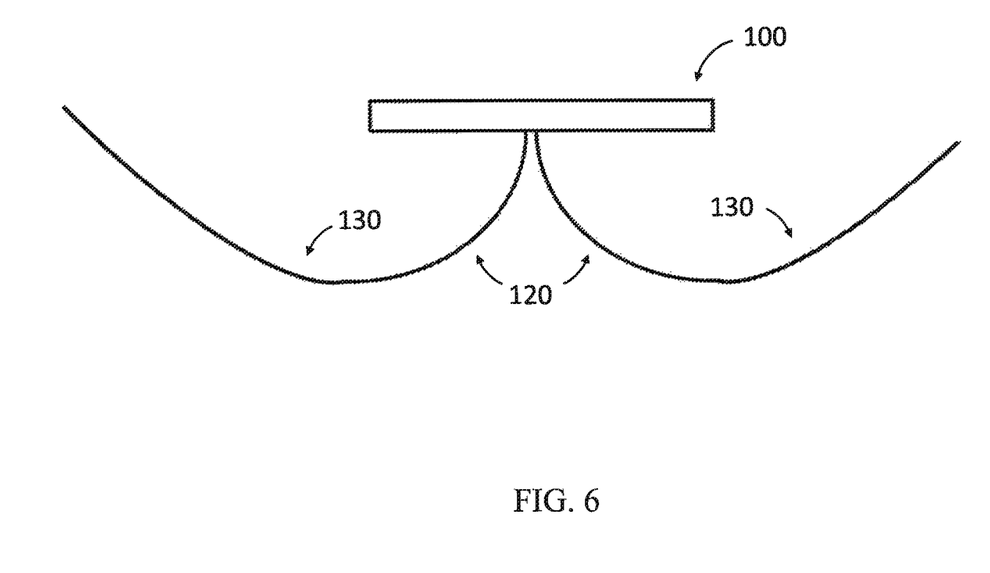
FIG. 6 is a schematic, perspective view of a photovoltaic system including a reflector having a compound-parabolic profile.

In some embodiments, reflectors 120 include reflective surfaces 130 having a rounded/curved outer surface configured to direct solar radiation toward the underside of the solar panel 100. In one embodiment, the reflective surface 130 has a semicircular-shaped profile, as illustrated in FIGS. 1 and 4. In these embodiments, the reflective surface 130 has a generally curved shape in two dimensions and extends linearly in the third dimension. Other curved objects having a long axis may be employed. For example, turning now to FIG. 6, a reflector 120 including a reflective surface 130 having a compound-parabolic-shaped profile is illustrated.

Figure 7:
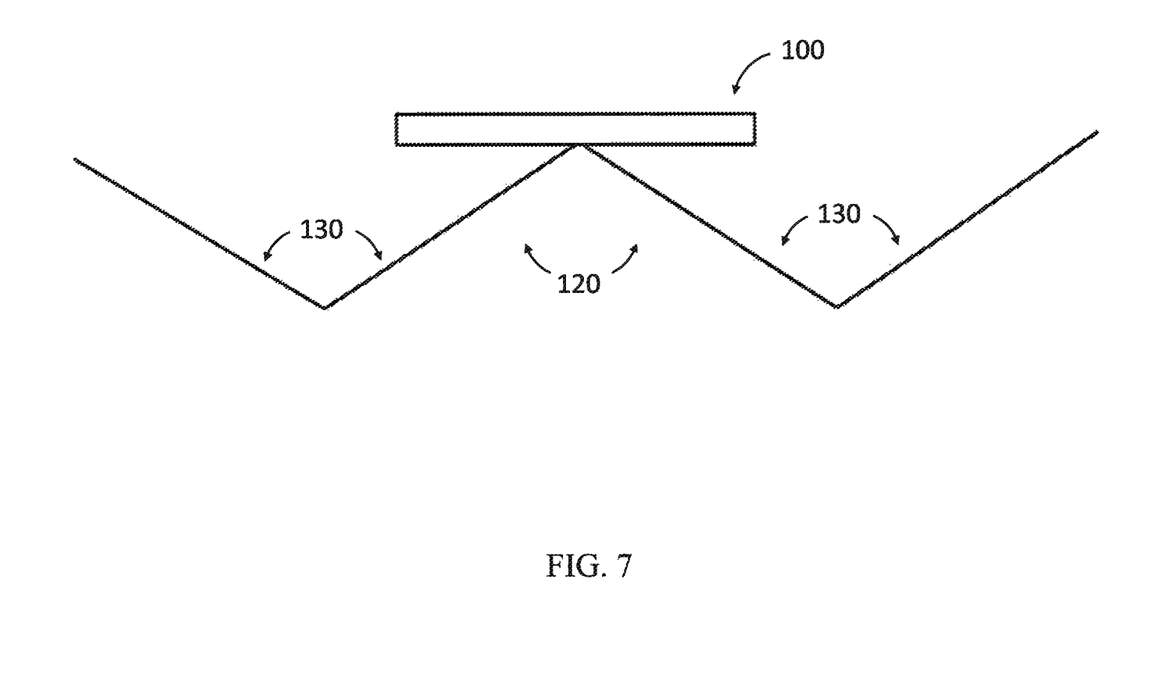
FIG. 7 is a schematic, perspective view of another embodiment of a photovoltaic system including a reflector having a triangular profile.
Figure 8:
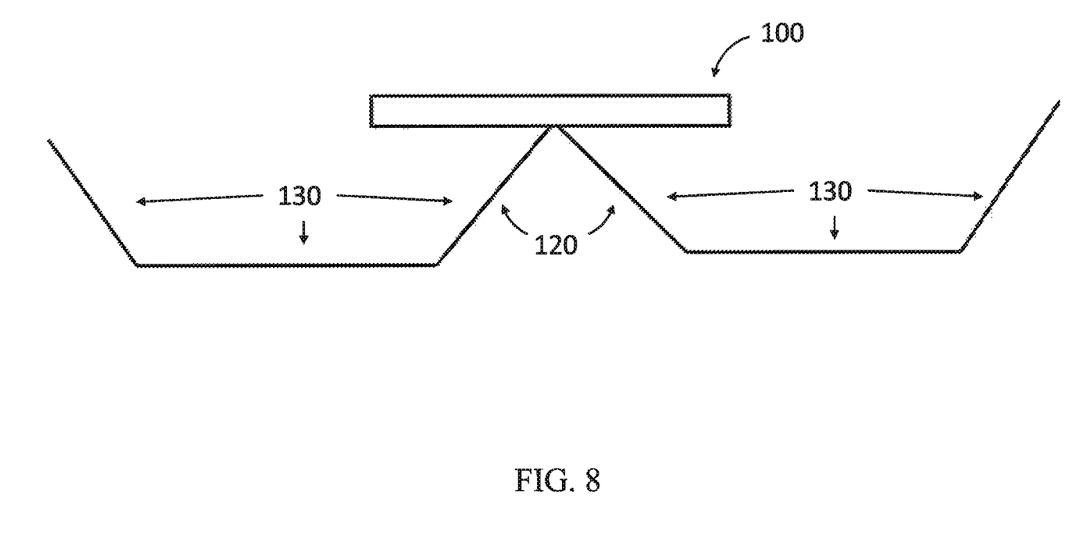
FIG. 8 is a schematic, perspective view of another embodiment photovoltaic system including a reflector having a trapezoidal profile.
Figure 9:
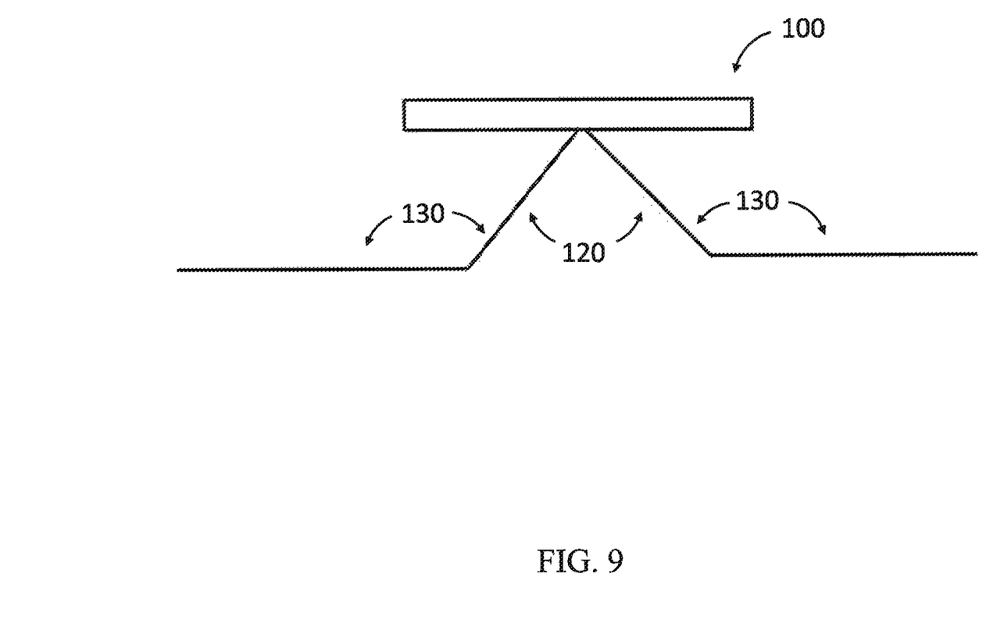
FIG. 9 is a schematic, perspective view of another embodiment photovoltaic system including a reflector having a profile comprising planar surfaces.

Turning now to FIGS. 7-9, various embodiments of reflectors 120 having planar shaped (i.e., non-curved) reflective surfaces 130 are illustrated. For example, the reflective surfaces 130 may comprise triangular and/or trapezoidal profiles, as shown in FIGS. 7-9. Such planar shaped reflective surfaces 130 may be used in some circumstances.

The reflective surfaces 130 may comprise highly reflective materials such as polished silver and/or aluminum. The reflective surfaces 130 may also be at least partially white (e.g., coated with white paint) to facilitate diffuse reflection of solar radiation toward the underside of the solar panel 100.

While various embodiments of the new technology described herein have been described in detail, it is apparent that modifications and adaptations of those embodiments will occur to those skilled in the art. However, it is to be expressly understood that such modifications and adaptations are within the spirit and scope of the presently disclosed technology.

What is claimed is:

1. A bifacial solar cell (110) comprising:
   (a) an n-type semiconductor layer (32);
   (b) a plurality of first metal conductivity lines (24) coupled to a first side of the n-type semiconductor layer (32);
      wherein at least some of the first metal conductivity lines (24) are in electrical communication with the n-type semiconductor layer (32);
   (c) a p-type crystalline silicon layer (36) coupled to a second side of the n-type semiconductor layer (32), wherein a thickness of the p-type crystalline silicon layer (36) is at least 20 micrometers;
   (d) a barrier layer (40) coupled to the p-type crystalline silicon layer (36), and located opposite the n-type semiconductor layer (32);
      wherein the barrier layer (40) comprises at least one of: oxides of vanadium, oxides of molybdenum, nitrides of aluminum, tungsten nickel oxide, and boron doped diamond; and
      wherein the bifacial solar cell (110) is absent an additional silicon-based layer between the n-type semiconductor layer (32) and the barrier layer (40);
   (e) a transparent conductive layer (44) coupled to the barrier layer (40), and located opposite the p-type crystalline silicon layer (36);
   (f) a plurality of second metal conductivity lines (48) coupled to the transparent conductive layer (44), and located opposite the barrier layer (40);
      wherein at least some of the second metal conductivity lines (48) are in electrical communication with the transparent conductive layer (44).

2. The bifacial solar cell (110) of claim 1, wherein the barrier layer is an oxide of vanadium.

3. The bifacial solar cell (110) of claim 2, wherein the composition of the oxide of vanadium is described by the empirical formula VxOy, and wherein $0.130 \leq x/(x+y) \leq 0.60$.

4. The bifacial solar cell (110) of claim 2, wherein the composition of the oxide of vanadium is described by the empirical formula $V_2O_5$.

5. The bifacial solar cell (110) of claim 2, wherein the thickness of the barrier layer is at least 1.0 nanometers.

6. The bifacial solar cell (110) of claim 2, wherein the thickness of the barrier layer is at least 2.0 nanometers.

7. The bifacial solar cell (110) of claim 2, wherein the thickness of the barrier layer is not greater than 10.0 nanometers.

8. The bifacial solar cell (110) of claim 2, wherein the thickness of the barrier layer is not greater than 6.0 nanometers.

9. The bifacial solar cell (110) of claim 1 comprising:
   a passivation layer (28),
      wherein the passivation layer (28) is coupled to the first side of the n-type semiconductor layer (32), and disposed between the plurality of first metal conductivity lines (24).

10. The bifacial solar cell (110) of claim 1, wherein the barrier layer (40) comprises at least one of nitrides of aluminum and boron doped diamond.

11. The bifacial solar cell (110) of claim 1, wherein the thickness of the p-type crystalline silicon layer (36) is at least 60 micrometers.

12. The bifacial solar cell (110) of claim 1, wherein the thickness of the p-type crystalline silicon layer (36) is at least 100 micrometers.

13. The bifacial solar cell (110) of claim 1, wherein the thickness of the p-type crystalline silicon layer (36) is not greater than 300 micrometers.

* * * * *